United States Patent
Fujita et al.

(10) Patent No.: US 11,892,515 B2
(45) Date of Patent: Feb. 6, 2024

(54) DETERMINATION DEVICE RELATING TO PLURALITY OF BATTERIES, ELECTRICITY STORAGE SYSTEM, DETERMINATION METHOD AND NON-TRANSITORY STORAGE MEDIUM

(71) Applicant: KABUSHIKI KAISHA TOSHIBA, Tokyo (JP)

(72) Inventors: Yumi Fujita, Tokyo (JP); Tomokazu Morita, Funabashi Chiba (JP); Nobukatsu Sugiyama, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 17/576,728

(22) Filed: Jan. 14, 2022

(65) Prior Publication Data
US 2022/0137151 A1    May 5, 2022

Related U.S. Application Data

(63) Continuation of application No. PCT/JP2021/008318, filed on Mar. 4, 2021.

(30) Foreign Application Priority Data

Sep. 7, 2020  (JP) ................. 2020-149664

(51) Int. Cl.
*G01R 31/392*    (2019.01)
*H01M 10/42*    (2006.01)
*H01M 10/48*    (2006.01)

(52) U.S. Cl.
CPC ........ *G01R 31/392* (2019.01); *H01M 10/425* (2013.01); *H01M 10/4285* (2013.01); *H01M 10/482* (2013.01); *H01M 2010/4271* (2013.01)

(58) Field of Classification Search
CPC ............. G01R 31/392; G01R 31/3835; H01M 10/425; H01M 10/4285; H01M 10/482; H01M 2010/4271
See application file for complete search history.

(56) References Cited

U.S. PATENT DOCUMENTS

2016/0197499 A1*  7/2016  Kaita ................... B60L 3/0046
                                                  320/103
2017/0125856 A1    5/2017  Okada et al.
(Continued)

FOREIGN PATENT DOCUMENTS

JP    2006-138750 A    6/2006
JP    2007-311255 A    11/2007
(Continued)

*Primary Examiner* — Christopher E Mahoney
(74) *Attorney, Agent, or Firm* — Finnegan, Henderson, Farabow, Garrett & Dunner, LLP

(57) ABSTRACT

According to one embodiment, a determination device relating to a plurality of batteries connected in series is provided. The determination device includes a processor. The processor determines a deterioration variance among the batteries, based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods.

10 Claims, 6 Drawing Sheets

(56) References Cited

U.S. PATENT DOCUMENTS

| | | | |
|---|---|---|---|
| 2018/0261893 A1 | 9/2018 | Fujita et al. | |
| 2018/0372803 A1 | 12/2018 | Yoshida | |
| 2019/0081369 A1 | 3/2019 | Monden et al. | |
| 2020/0294090 A1 | 9/2020 | Morita et al. | |
| 2021/0075232 A1* | 3/2021 | Jordan | H02J 7/0029 |
| 2022/0137153 A1* | 5/2022 | Morita | G01R 31/392 |
| | | | 702/63 |
| 2022/0146585 A1* | 5/2022 | Hong | G01R 31/396 |

FOREIGN PATENT DOCUMENTS

| | | |
|---|---|---|
| JP | 2011-54413 A | 3/2011 |
| JP | 2014-240807 A | 12/2014 |
| JP | WO 2013/128811 A1 | 7/2015 |
| JP | 2018-147827 A | 9/2018 |
| JP | WO 2017/154112 A1 | 12/2018 |
| JP | 2019-216528 A | 12/2019 |
| JP | 2020-150687 A | 9/2020 |

\* cited by examiner

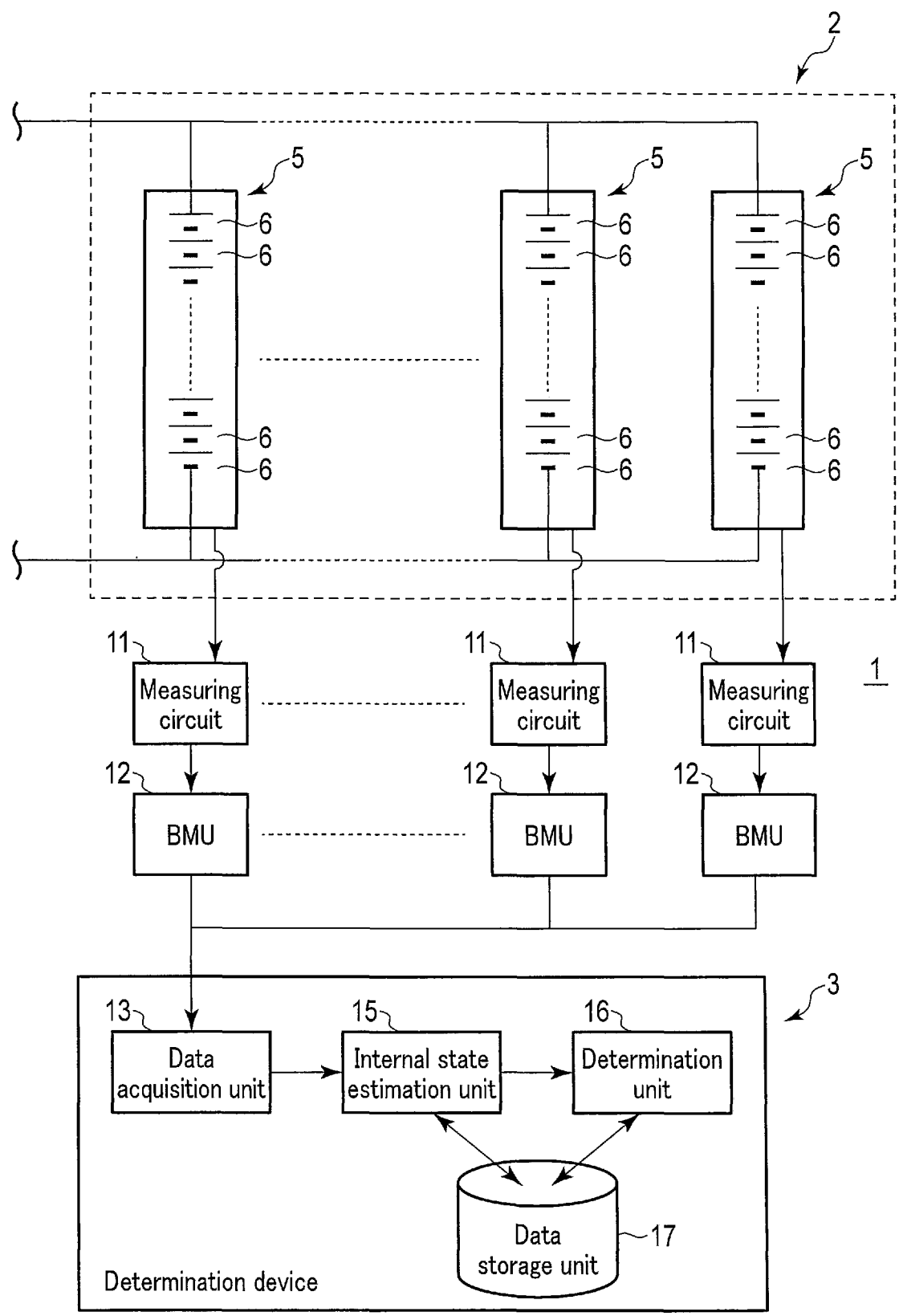
F I G. 1

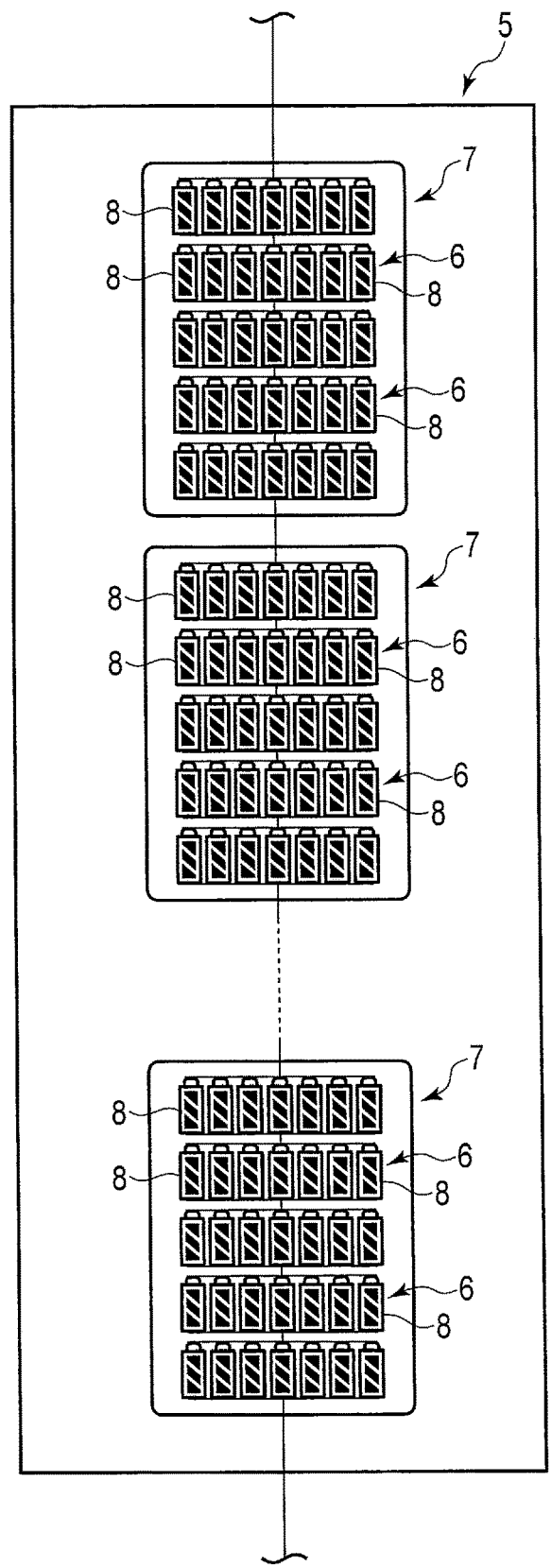
F I G. 2

DETERMINATION DEVICE RELATING TO PLURALITY OF BATTERIES, ELECTRICITY STORAGE SYSTEM, DETERMINATION METHOD AND NON-TRANSITORY STORAGE MEDIUM

CROSS-REFERENCE TO RELATED APPLICATIONS

This is a Continuation application of PCT Application No. PCT/JP2021/008318, filed Mar. 4, 2021 and based upon and claiming the benefit of priority from prior Japanese Patent Application No. 2020-149664, filed Sep. 7, 2020, the entire contents of which are incorporated herein by reference.

FIELD

Embodiments described herein relate to a determination device relating to a plurality of batteries, an electricity storage system, a determination method, and a non-transitory storage medium.

BACKGROUND

In recent years, a storage battery has been mounted in battery-mounted devices such as a large-sized storage battery for an electric power system, a smartphone, a vehicle, a stationary power source device, a robot and a drone, thus constituting an electricity storage system. In the storage battery of such an electricity storage system, a large number of batteries, such as lithium ion batteries, are provided, and the large number of batteries are electrically connected. In addition, from the standpoint of safety maintenance and performance ascertainment of the storage battery, diagnosis technologies of the storage battery have been developed.

As a diagnosis technology of the storage battery, there is known a technology of determining a deterioration degree of each of a plurality of batteries in the structure in which the batteries are connected in series. In this diagnosis technology, the internal resistance of each battery is calculated from a variation in voltage of the battery during charge. Further, based on the internal resistance of each battery, the deterioration degree of each battery is determined.

In the structure in which the batteries are connected in series as described above, it is required to appropriately determine a deterioration variance between the batteries. In addition, for example, also in a case in which many batteries are connected in series, it is required to determine the deterioration variance among the many batteries without complicating the structure and process for acquiring data, such as by decreasing the amount of data necessary for the process.

BRIEF DESCRIPTION OF THE DRAWINGS

FIG. 1 is a schematic view illustrating an example of an electricity storage system according to an embodiment.

FIG. 2 is a schematic view illustrating an example of a structure of a battery string according to the embodiment.

DETAILED DESCRIPTION

Figure 3:
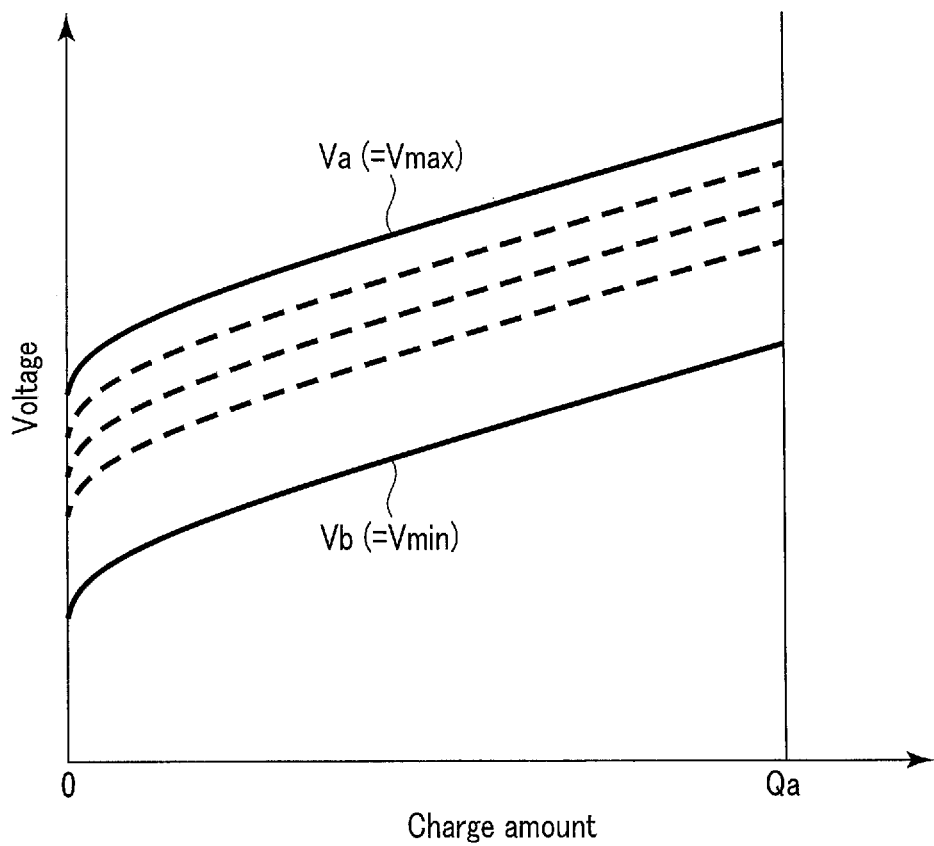
FIG. 3 is a schematic view illustrating an example of variations of voltages of a plurality of batteries in the charge of the battery string according to the embodiment.

According to one embodiment, a determination device relating to a plurality of batteries connected in series is provided. The determination device includes a processor. The processor determines a deterioration variance among the batteries, based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods. The processor estimates a first internal state parameter as an internal state of the battery as an elemental battery, the first internal state parameter being based on a variation of the maximum voltage in the first voltage data. The processor estimates a second internal state parameter as an internal state of the battery as the elemental battery, the second internal state parameter being based on a variation of the minimum voltage in the second voltage data. The processor determines the deterioration variance among the batteries, based on at least the first internal state parameter and the second internal state parameter. The processor estimates a third internal state parameter indicative of an internal state in an entirety of a series-connected part of the batteries, based on at least third voltage data indicative of a voltage of the series-connected part of the batteries in each of the measurements in the periods in the charge or the discharge of the batteries. The processor determines the deterioration variance among the batteries by comparing the third internal state parameter with the first internal state parameter and the second internal state parameter.

Hereinafter, embodiments will be described with reference to the accompanying drawings.

FIG. 1 is a schematic view illustrating an example of an electricity storage system according to an embodiment. As illustrated in FIG. 1, an electricity storage system 1 includes a storage battery 2 and a determination device 3. The storage battery 2 is mounted, for example, in a battery-mounted device. Examples of the battery-mounted device include a large-sized storage battery for an electric power system, a smartphone, a vehicle, a stationary power source device, a robot, a drone, and the like. Examples of the vehicle, which is the battery-mounted device, include a railway vehicle, an electric bus, an electric automobile, a plug-in hybrid automobile, an electric bicycle, and the like.

The storage battery 2 includes at least one battery string 5. When a plurality of battery strings 5 are provided in the storage battery 2, the battery strings 5 are electrically connected in parallel. Examples of the battery string 5 include a battery panel, an assembled battery, a battery pack, and the like. Each of the battery strings 5 includes a plurality of batteries 6, and the batteries 6 are electrically connected in series in each of the battery strings 5. Each of the batteries 6 is a secondary battery such as a lithium ion battery. In each of the battery strings 5, each of the batteries 6 is chargeable and dischargeable. In each battery string 5, each battery 6 is charged by being supplied with electric power from a power source. In addition, in each battery string 5, electric power discharged from each battery 6 is supplied to a load. In general, in a new electricity storage system, a plurality of batteries 6 of an identical kind to each other are used in each battery string 5. Thus, when the use of the storage battery 2 is started, the batteries 6 in each battery string 5 have identical or substantially identical internal states to each other. However, this does not apply to the case of, for example, an electricity storage system in which reused batteries are employed. The internal state of the battery 6 will be described later.

FIG. 2 is a schematic view illustrating an example of the structure of the battery string according to the embodiment. In an example of FIG. 2, in the battery string 5, a plurality of battery modules 7 are electrically connected in series. In addition, in each of the battery modules 7, a plurality of batteries 6 are electrically connected in series. Thus, in the battery string 5, many batteries 6 are electrically connected in series. Accordingly, the battery string 5 is a series-connected part of a plurality of batteries 6. In one example, the number of series-connected batteries 6 in the battery string 5 is several hundred. Further, in the example of FIG. 2, each of the batteries 6 includes a plurality of unit cells 8. In each battery 6, the unit cells 8 are electrically connected in parallel. Specifically, in the example of FIG. 2, each battery 6 is formed of a cell block in which the unit cells 8 are connected in parallel. Accordingly, in the example of FIG. 2, in the battery string 5, a plurality of cell blocks are electrically connected in series. In another example, each of the batteries 6 may be formed of one unit cell 8. In still another example, in each battery 6, a plurality of unit cells 8 may be connected in series. In still another example, in each battery 6, both of a series-connected structure in which a plurality of unit cell 8 are connected in series, and a parallel-connected structure in which plurality of unit cell 8 are connected in parallel, may be formed.

In the power storage system 1, a measuring circuit 11 and a battery management unit (BMU) 12 are provided for each battery string 5. Accordingly, in a battery-mounted device or the like in which the storage battery 2 is mounted, the same number of measuring circuits 11 and the same number of battery management units 12 as the number of battery strings 5 are provided. Each measuring circuit 11 detects and measures parameters relating to the corresponding battery string 5, in the charge or discharge of the corresponding battery string 5. In each of the measuring circuits 11, the parameters are detected and measured periodically at a predetermined timing. Specifically, each measuring circuit 11 measures the parameters relating to the corresponding battery string 5 in each of a plurality of measuring periods. Thus, each measuring circuit 11 measures multiple times the parameters relating to the corresponding battery string 5 in the charge or discharge of the corresponding battery string 5. Note that a period in which each measuring circuit 11 executes the measurement in the charge or discharge of the corresponding battery string 5 is defined as "measuring period". The parameters relating to the battery string 5 include an electric current flowing in the battery string 5 (i.e. an electric current flowing in each of the batteries 6), a voltage of the entirety of the battery string 5 (a voltage of the entirety of the series-connected part of the batteries 6), and a voltage of each of the batteries 6 of the battery string 5. Thus, the measuring circuit 11 includes an amperemeter which measures the current, and a voltmeter which measures the voltage. Further, the measuring circuit 11 may measure either the temperature of the battery string 5, or the temperature of each of the batteries 6. In this case, the measuring circuit 11 includes a temperature sensor or the like which measures the temperature. Each of the measuring circuits 11, in each of a plurality of measuring periods, may measure the above-described parameters relating to the corresponding battery string 5 at an identical time point, or may measure the above-described parameters relating to the corresponding battery string 5 at different time points in an identical measuring period.

Each of the battery management units 12 constitutes a processing device (computer) which manages the corresponding battery string 5, and includes a processor and a storage medium (non-transitory storage medium). The processor includes any one of a CPU (Central Processing Unit), a GPU (Graphics Processing Unit), an ASIC (Application Specific Integrated Circuit), a microcomputer, an FPGA (Field Programmable Gate Array), and a DSP (Digital Signal Processor), and the like. The storage medium may include an auxiliary storage device, in addition to a main storage device such as a memory. Examples of the storage medium include a magnetic disk, an optical disc (e.g. CD-ROM, CD-R, DVD), a magneto-optical disc (e.g. MO), and semiconductor memory. In each of the battery management unit 12, each of the number of processors and the number of storage media may be one or plural. In each battery management unit 12, the processor executes a program or the like stored in the storage medium or the like, thereby executing a process. In addition, in each battery management unit 12, the program that is executed by the processor may be stored in a computer (server) connected via a network such as the Internet, or may be stored in a server or the like in a cloud environment. In this case, the processor downloads the program via the network.

The determination device 3 may be provided in the battery-mounted device in which the storage battery 2 is mounted, or may be provided outside the battery-mounted device. The determination device 3 executes a determination process in regard to each of the battery strings 5, and includes a data acquisition unit 13, an internal state estimation unit 15, a determination unit 16 and a data storage unit 17. In one example, the determination device 3 is a server which can communicate with each of the battery management units 12 via a network. In this case, like each battery management unit 12, the determination device 3 includes a processor and a storage medium (non-transitory storage medium). In addition, the data acquisition unit 13, internal state estimation unit 15 and determination unit 16 execute a part of processes which are executed by the processor or the like of the determination device 3, and the storage medium of the determination device 3 functions as the data storage unit 17. In another example, the determination device 3 is a cloud server constituted in a cloud environment. The infrastructure of the cloud environment is constituted by a virtual processor, such as a virtual CPU, and a cloud memory. Thus, when the determination device 3 is the cloud server, the data acquisition unit 13, internal state estimation unit 15 and determination unit 16 execute a part of processes which are executed by the virtual processor. Further, the cloud memory functions as the data storage unit 17.

Note that the data storage unit 17 may be provided in a computer which is different from the battery management unit 12 and determination device 3. In this case, the determination device 3 is connected via a network to a computer in which the data storage unit 17 or the like is provided.

In the determination device 3, the processor executes the determination relating to a deterioration degree of each of the battery strings 5, and the determination relating to a deterioration variance among the batteries 6 in each of the battery strings 5. In the storage battery 2 having the above-described structure, if a certain period has passed since the start of use, there is a possibility that a variance (difference) occurs in internal states among the batteries 6 in each of the battery strings 5. In each battery string 5, the variance in the internal states among the batteries 6 also leads to a variance in the deterioration degrees among the batteries. With the deterioration variance being suppressed among the batteries 6, it is possible to prevent the occurrence of a battery 6 whose deterioration degree is excessively great, compared to the other batteries 6, and to effectively prevent the occurrence of a battery 6 whose load is excessively great, compared to the other batteries 6. Thus, a fast progress of deterioration in the battery string 5 is prevented, and deterioration in performance of the battery string 5 is prevented. In addition, by the effective prevention of the occurrence of a battery 6 whose load is excessively great, compared to the other batteries 6, the occurrence of an accident is effectively prevented and the safety is secured. Thus, in each of the battery strings 5, it is important that the deterioration variance among the batteries 6, in addition to the deterioration degree of the battery string 5, is properly determined. Hereinafter, description will be given of a determination process relating to one certain battery string 5, i.e. a determination process relating to a plurality of batteries which are connected in series. Note that the determination process described below is similarly executed for the other battery strings 5.

When the determination is performed in regard to a certain battery string 5, the battery string 5 is charged or discharged, and the corresponding measuring circuit 11 measures the above-described parameters (the parameters relating to the series-connected batteries 6) relating to the battery string 5. In addition, the corresponding battery management unit 12 acquires measurement values in the measuring circuit 11 of the parameters relating to the battery string 5. Thus, the battery management unit 12 acquires an electric current flowing in the battery string 5 (i.e. an electric current flowing in each of the batteries 6), a voltage of the entirety of the battery string 5 (a voltage of the entirety of the series-connected part of the batteries 6), and a voltage of each of the batteries 6 of the battery string 5. The battery management unit 12 periodically acquires at a predetermined timing the measurement values of the parameters relating to the battery string 5. Specifically, the battery management unit 12 acquires the measurement values of the parameters relating to the battery string 5 in regard to each of a plurality of measuring periods. For example, the battery management unit 12 acquires the measurement values of the voltages of the batteries 6 in regard to each of the measuring periods. Thus, the battery management unit 12 also acquires, as measurement data, a time variation (time history) of parameters relating to the battery string 5, in addition to the measurement values of the parameters relating to the battery string 5. Accordingly, the measurement data that the battery management unit 12 acquires includes the time variation (time history) of the current flowing in the battery string 5, the time variation (time history) of the voltage of the entirety of the battery string 5, and the time variation (time history) of the voltage of each of the batteries 6 of the battery string 5. Further, the measurement data may include either the time variation of the temperature of the battery string 5, or the time variation of the temperature of each of the batteries 6. Note that each of the measuring circuits 11, in each of a plurality of measuring periods, may measure the voltages of the batteries 6 of the battery string 5 at an identical time point, or may measure the voltages of the batteries 6 of the battery string 5 at different time points in an identical measuring period.

Besides, the battery management unit 12 may acquire charge conditions or discharge conditions at a time of measuring the parameters relating to the battery string 5, in addition to the above-described measurement data. The charge conditions include a charge current value, an SOC (State of Charge) of the battery string 5 at the start of charge and the end of charge, and the temperature range of the battery string 5 at the time of charge. Similarly, the discharge conditions include a discharge current value, the SOC of the battery string 5 at the start of discharge and the end of discharge, and the temperature range of the battery string 5 at the time of discharge.

The battery management unit 12 may acquire, as measurement data, data indicative of a relationship of the voltage of the battery string 5 to either a charge amount (discharge amount) of the battery string 5 from the start of charge (the start of discharge) or the SOC of the battery string 5. In addition, the battery management unit 12 may acquire, as measurement data, data indicative of a relationship of the voltage of each of the batteries 6 to either a charge amount (discharge amount) of the battery string 5 from the start of charge (start of discharge) or the SOC of the battery string 5. The charge amount (discharge amount) of the battery string 5 from the start of charge (start of discharge) can be calculated by using the elapsed time from the start of charge (start of discharge) and the time variation (time history) of the current flowing in the battery string 5 (the batteries 6 of the battery string 5). In addition, in the present embodiment, because of the configuration in which the batteries 6 are connected in series in the battery string 5, the charge amount (discharge amount) of the battery string 5 from the start of charge (start of discharge) corresponds to the charge amount (discharge amount) of the battery 6 as an elemental battery from the start of charge (start of discharge).

The SOC of the battery string 5 is indicative of the ratio of the residual capacitance of the battery string 5 until the SOC reaches 0% to the full-charge capacitance of the battery string 5 until the SOC reaches 100% from 0%. The SOC of the battery string 5 can be calculated by using the above-described measurement data and the charge/discharge history or the like of the battery string 5. Examples of the method of calculating the SOC of the battery string 5 include a current integration method, a calculation method using the relationship between the inter-terminal voltage and the SOC in the battery string 5, and an estimation method using a Kalman filter.

Note that, in regard to each of the batteries 6, the ratio of the residual, capacitance until the SOC reaches 0% relative to the full-charge capacitance is defined as the SOC. In each of the batteries 6, the state in which the inter-terminal voltage (the voltage between the positive electrode terminal and the negative electrode terminal) has a voltage value $V\alpha 1$ under set discharge conditions is defined as the state in which the SOC is 0%, and the state in which the inter-terminal voltage has a voltage value $V\alpha 2$, which is greater than the voltage value $V\alpha 1$, under set charge conditions is defined as the state in which the SOC is 100%. In addition, when the battery string 5 is regarded as one battery, if the number of series-connected batteries in the battery string 5 is N, the state in which the inter-terminal voltage is N×Vα1 in the battery string 5 is defined as the state of the SOC=0% in the battery string 5, and the state in which the inter-terminal voltage is N×Vα2 is defined as the state in which SOC is 100%. However, in the battery string 5, the state in which one of the N-number of batteries 6 reaches Vα1 may be defined as the state in which the SOC is 0%, and the state in which one of the N-number of batteries 6 reaches Vα2 may be defined as the state in which the SOC is 100%.

In addition, in the present embodiment, the battery management unit 12 calculates, based on the measurement data, first voltage data indicative of a variation of a maximum voltage Vmax, which is greatest among the voltages of the batteries 6 of the battery string 5, in the charge or discharge of the battery string 5. Here, in the charge or discharge of the batteries 6 of the battery string 5, as described above, the voltages of the batteries 6 are periodically measured, and the battery management unit 12 acquires measurement values of the voltages of the batteries 6 in each of a plurality of measuring periods (each measurement in a plurality of periods). The maximum voltage Vmax is defined in each measuring period (in each measurement in periods), and the greatest voltage among the voltages of the batteries 6 in each measuring period is defined as the maximum voltage Vmax. In addition, the data indicative of the maximum voltage Vmax in two or more measuring periods becomes first voltage data. Accordingly, the data indicative of the maximum voltage Vmax, which is greatest among the voltages of the batteries 6, in each measuring period in the charge or discharge of the battery string 5, becomes the first voltage data. Specifically, a set of maximum voltages Vmax in the respective measuring periods becomes first voltage data, and the first voltage data indicates the maximum voltage Vmax, which is greatest among the voltages of the batteries 6, in each measurement in the periods in the charge or discharge of the battery string 5. The first voltage data may be data indicative of a time variation (time history) of the maximum voltage Vmax in the charge or discharge, or may be data indicative of a relationship of the maximum voltage Vmax to either the charge amount (discharge amount) of the battery string 5 from the start of charge (start of discharge) or the SOC of the battery string 5.

Besides, the battery management unit 12 calculates, based on the measurement data, second voltage data indicative of a variation of a minimum voltage Vmin, which is least among the voltages of the batteries 6 of the battery string 5, in the charge or discharge of the batteries 6 of the battery string 5. Like the maximum voltage Vmax, the minimum voltage Vmin is defined in each measuring period (in each measurement in periods). In each measuring period, the least voltage among the voltages of the batteries 6 is defined as the minimum voltage Vmin. In addition, the data indicative of the minimum voltage Vmin in two or more measuring periods becomes second voltage data. Accordingly, the data indicative of the minimum voltage Vmin, which is least among the voltages of the batteries 6, in each measuring period in the charge or discharge of the battery string 5, becomes the second voltage data. Specifically, a set of minimum voltages Vmin in the respective measuring periods becomes second voltage data, and the second voltage data indicates the minimum voltage Vmin, which is least among the voltages of the batteries 6, in each measurement in the periods in the charge or discharge of the battery string 5. The second voltage data may be data indicative of a time variation (time history) of the minimum voltage Vmin in the charge or discharge, or may be data indicative of a relationship of the minimum voltage Vmin to either the charge amount (discharge amount) of the battery string 5 from the start of charge (start of discharge) or the SOC of the battery string 5.

Here, the first voltage data and the second voltage data will be described. The first voltage data and second voltage data are generated based on at least measurement results of voltages of the batteries 6 in the measuring circuit 11. FIG. 3 is a schematic view illustrating an example of variations of voltages of a plurality of batteries in the charge of the battery string according to the embodiment. In the example of FIG. 3, a relationship of voltages of the batteries 6 to the charge amount of the battery string 5 from the start of charge (the charge amount of the elemental battery 6 from the start of charge) is indicated. In addition, in the example of FIG. 3, the voltages of the batteries 6 are periodically measured (multiple times) in a plurality of periods from the start of charge (from the state in which the charge amount is 0) until the charge amount reaches Qa. In addition, FIG. 3 shows, by solid lines, a variation of a voltage Va of one battery 6a among the batteries 6, and a variation of a voltage Vb of another battery 6b which is different from the battery 6a among the batteries 6. Besides, variations of voltages of the batteries 6 other than the batteries 6a and 6b are indicated by broken lines.

In the example of FIG. 3, in any part of a range of 0 to Qa of the charge amount, the voltage Va of the battery 6a is a maximum voltage Vmax which is greatest among the voltages of the batteries 6. Thus, in any part of the range of 0 to Qa of the charge amount, i.e. in any part of the range of the charge amount in which the voltages of the batteries 6 were measured, the data indicative of the variation of the voltage Va of the battery 6a corresponds to the data indicative of the variation of the maximum voltage Vmax. Accordingly, the data indicative of the variation of the voltage Va of the battery 6a in the charge becomes the first voltage data indicative of the variation of the maximum voltage Vmax in the charge. In other words, the data indicative of the voltage Va of the battery 6a in each measurement in a plurality of periods becomes the first voltage data indicative of the maximum voltage Vmax in each measurement in a plurality of periods in the charge. In addition, in the example of FIG. 3, in any part of the range of 0 to Qa of the charge amount, the voltage Vb of the battery 6b is a minimum voltage Vmin which is least among the voltages of the batteries 6. Thus, in any part of the range of 0 to Qa of the charge amount, i.e. in any part of the range of the charge amount in which the voltages of the batteries 6 were measured, the data indicative of the variation of the voltage Vb of the battery 6b corresponds to the data indicative of the variation of the minimum voltage Vmin. Accordingly, the data indicative of the variation of the voltage Vb of the battery 6b in the charge becomes the second voltage data indicative of the variation of the minimum voltage Vmin in the charge. In other words, the data indicative of the voltage Vb of the battery 6b in each measurement in a plurality of periods becomes the second voltage data indicative of the minimum voltage Vmin in each measurement in a plurality of periods in the charge.

Figure 4A:
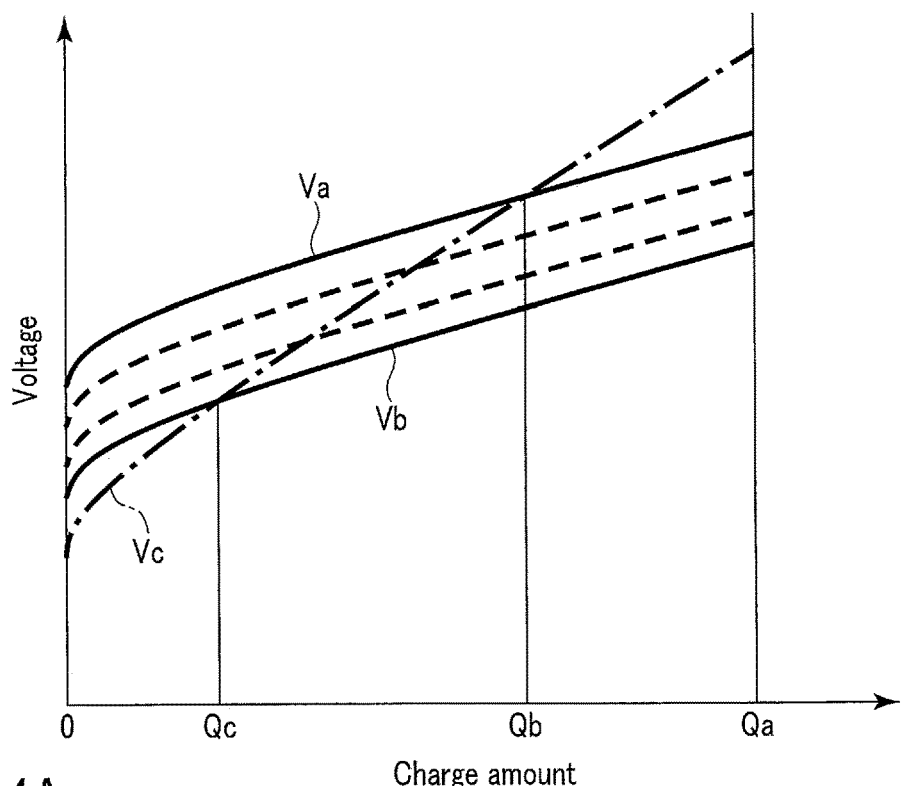
FIG. 4A is a schematic view illustrating an example of variations of voltages of batteries in the charge of the battery string according to the embodiment, this example being different from the example of FIG. 3.
Figure 4B:
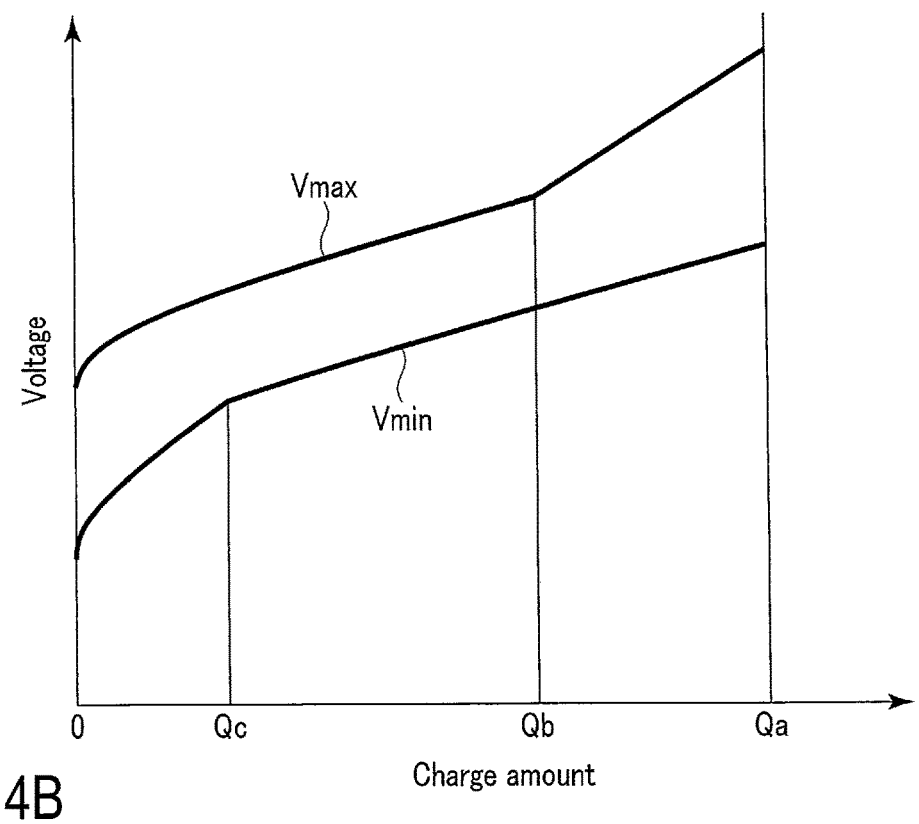
FIG. 4B is a schematic view illustrating first voltage data and second voltage data generated in the example of FIG. 4A.

FIG. 4A is a schematic view illustrating an example of variations of voltages of batteries during the charge of the battery string according to the embodiment, this example being different from the example of FIG. 3. Also in the example of FIG. 4A, a relationship of voltages of the batteries 6 to the charge amount of the battery string 5 from the start of charge (the charge amount of the elemental battery 6 from the start of charge) is indicated. In addition, also in the example of FIG. 4A, the voltages of the batteries 6 are periodically measured (multiple times) in a plurality of periods from the start of charge (from the state in which the charge amount is 0) until the charge amount reaches Qa. FIG. 4A shows, by solid lines, a variation of the voltage Va of the battery 6a and a variation of the voltage Vb of the battery 6b, and shows, by a dot-and-dash line, a variation of a voltage Vc of a battery 6c which is different from the batteries 6a and 6b of the batteries 6. Besides, variations of voltages of the batteries 6 other than the batteries 6a, 6b and 6c are indicated by broken lines. Further, FIG. 4B is a schematic view illustrating first voltage data and second voltage data generated in the example of FIG. 4A.

In the example of FIG. 4A, a battery, which takes a maximum voltage Vmax among the batteries 6, becomes different at a charge amount Qb (0<Qb<Qa) as a boundary. Specifically, in a range of 0 to less than Qb of the charge amount, the voltage Va of the battery 6a is the maximum voltage Vmax which is greatest among the voltages of the batteries 6. Besides, in a range of Qb to Qa of the charge amount, the voltage Vc of the battery 6c is the maximum voltage Vmax. Thus, in the range of 0 to less than Qb of the charge amount, the data indicative of the variation of the voltage Va of the battery 6a corresponds to the data indicative of the variation of the maximum voltage Vmax, and, in the range of Qb to Qa of the charge amount, the data indicative of the variation of the voltage Vc of the battery 6c corresponds to the data indicative of the variation of the maximum voltage Vmax. Accordingly, using the data indicative of the variations of the voltages Va and Vc of the batteries 6a and 6c in the charge, the first voltage data indicative of the variation of the maximum voltage Vmax in the charge, i.e. the first voltage data indicative of the maximum voltage Vmax in each measurement in the plural periods in the charge, is generated. In this case, for example, the data indicative of the relationship of the maximum voltage Vmax to the charge amount from the start of charge of the battery string 5 in FIG. 4B is generated as the first voltage data.

In addition, in the example of FIG. 4A, a battery, which takes a minimum voltage Vmin among the batteries 6, becomes different at a charge amount Qc (0<Qc<Qb<Qa) as a boundary. Specifically, in a range of 0 to less than Qc of the charge amount, the voltage Vc of the battery 6c is the minimum voltage Vmin which is least among the voltages of the batteries 6. Besides, in the range of Qc to Qa of the charge amount, the voltage Vb of the battery 6b is the minimum voltage Vmin. Thus, in the range of 0 to less than Qc of the charge amount, the data indicative of the variation of the voltage Vc of the battery 6c corresponds to the data indicative of the variation of the minimum voltage Vmin, and, in the range of Qc to Qa of the charge amount, the data indicative of the variation of the voltage Vb of the battery 6b corresponds to the data indicative of the variation of the minimum voltage Vmin. Accordingly, using the data indicative of the variations of the voltages Vb and Vc of the batteries 6b and 6c in the charge, the second voltage data indicative of the variation of the minimum voltage Vmin in the charge, i.e. the second voltage data indicative of the minimum voltage Vmin in each measurement in the plural periods in the charge, is generated. In this case, for example, the data indicative of the relationship of the minimum voltage Vmin to the charge amount from the start of charge of the battery string 5 in FIG. 4B is generated as the second voltage data.

In addition, when the battery modules 7 are connected in series in the battery string 5 as in the example of FIG. 2, the same number of module management units (not shown) as the number of battery modules 7 provided in the battery string 5 may be provided as management device which are slaves of the battery management unit 12. In this case, each of the module management units constitutes a processing device (computer) which manages the corresponding battery module 7 of the battery string 5, and includes, like the battery management unit 12, a processor and a storage medium. Further, in one example, the same number of measuring circuits 11 as the number of battery modules 7 provided in the battery string 5 may be provided. In this case, each of the measuring circuits 11 detects and measures parameters relating to the corresponding battery module 7 in the charge or discharge of the corresponding battery module 7.

In addition, each of the module management units may acquire a measurement value of a voltage in regard to each of the batteries 6 provided in the corresponding battery module 7. In this case, each of the module management units calculates, based on the acquired measurement values, provisional maximum voltage data indicative of a variation of a greatest voltage among the voltages of the batteries 6 of the corresponding battery module 7 in the charge or discharge of the battery string 5. Further, each of the module management units calculates, based on the acquired measurement values, provisional minimum voltage data indicative of a variation of a least voltage among the voltages of the batteries 6 of the corresponding battery module 7 in the charge or discharge of the battery string 5. In addition, the provisional maximum voltage data and provisional minimum voltage data are output from each of the module management units to the battery management unit 12. Then, the battery management unit 12 generates the above-described first voltage data, based on the provisional maximum voltage data that is output from each of the module management units, and generates the above-described second voltage data, based on the provisional minimum voltage data that is output from each of the module management units.

The battery management unit 12 outputs to the determination device 3 the data indicative of the variation of the electric current flowing in the battery string 5 in the charge or discharge of the battery string 5. In addition, the battery management unit 12 outputs the above-described first voltage data and second voltage data to the determination device 3. Further, the battery management unit 12 also outputs (transmits), to the determination device 3, third voltage data indicative of a variation of a voltage of the entirety of the battery string 5 (a voltage of the entirety of the series-connected part of the batteries 6) in the charge or discharge of the battery string 5. The third voltage data is included in the above-described measurement data, and the third voltage data indicates the voltage of the entirety of the battery string 5 in each measurement in the plural periods in the charge or discharge of the battery string 5. Besides, the third voltage data may be data indicative of a time variation (time history) of the voltage of the battery string 5 in the charge or discharge, or may be data indicative of a relationship of the voltage of the battery string 5 to either the charge amount (discharge amount) of the battery string 5 from the start of charge (start of discharge) or the SOC of the battery string 5.

Note that the battery management unit 12 may also output to the determination device 3 the data which is included in the measurement data and is other than the third voltage data. In one example, either data indicative of a variation of the temperature of the battery string 5 in the charge or discharge of the battery string 5, or data indicative of a variation of the temperature of each of the batteries 6 in the charge or discharge of the battery string 5, is output to the determination device 3 in addition to the above-described first voltage data, second voltage data and third voltage data. In addition, the battery management unit 12 may output to the determination device 3 charge conditions or discharge conditions at the time of measuring the parameters relating to the battery string 5.

The data acquisition unit 13 of the determination device 3 receives and acquires the data that is output from the battery management unit 12. Accordingly, the data acquisition unit 13 acquires at least the first voltage data, second voltage data and third voltage data. The data acquisition unit 13 also receives the charge conditions or discharge conditions at the time of measuring the parameters relating to the battery string 5. Note that, in the above-described embodiment, the battery management unit 12 or the like generates the first voltage data and second voltage data, but the data acquisition unit 13 of the determination device 3 may generate the first voltage data and second voltage data. In this case, the data acquisition unit 13 acquires the measurement values of the parameters relating to the battery string 5 and the above-described measurement data from the battery management unit 12 or the like. Then, the data acquisition unit 13 generates the first voltage data and second voltage data, based on the measurement values of the parameters relating to the battery string 5 and the measurement data.

The internal state estimation unit 15 executes a process by using the first voltage data, second voltage data and third voltage data acquired by the data acquisition unit 13. The internal state estimation unit 15 estimates a first internal state parameter, based on the first voltage data or the like. The first internal state parameter is a parameter indicative of an internal state of the elemental battery 6 in a case where the voltage varies like the first voltage data in the charge or discharge. Specifically, the first internal state parameter indicates the internal state of the elemental battery 6 in a case where the voltage in each measurement in the plural periods becomes identical to the maximum voltage Vmax of the first voltage data. Accordingly, by estimating the first internal state parameter, the internal state of the elemental battery 6 in the case where the voltage varies like the maximum voltage Vmax in the charge or discharge is estimated. In one example, the internal state estimation unit 15 estimates the first internal state parameter by performing charge curve analysis (discharge curve analysis), for example, by analyzing the first voltage data indicative of the variation of the maximum voltage Vmax in the charge (discharge) and the data indicative of the variation of the current flowing in the battery string 5 in the charge (discharge). Note that, in the example of FIG. 3, the internal state of the battery 6a is substantially estimated by estimating the first internal state parameter. In addition, in the example of FIG. 4A and FIG. 4B, an internal state of a virtual battery, the voltage of which varies like the maximum voltage Vmax in the charge, is estimated by estimating the first internal state parameter.

In addition, the internal state estimation unit 15 estimates a second internal state parameter, based on the second voltage data or the like. The second internal state parameter is a parameter indicative of an internal state of the elemental battery 6 in a case where the voltage varies like the second voltage data in the charge or discharge. Specifically, the second internal state parameter indicates the internal state of the elemental battery 6 in a case where the voltage in each measurement in the plural periods becomes identical to the minimum voltage Vmin of the second voltage data. Accordingly, by estimating the second internal state parameter, the internal state of the elemental battery 6 in the case where the voltage varies like the minimum voltage Vmin in the charge or discharge is estimated. In one example, the internal state estimation unit 15 estimates the second internal state parameter by performing charge curve analysis (discharge curve analysis), for example, by analyzing the second voltage data indicative of the variation of the minimum voltage Vmin in the charge (discharge) and the data indicative of the variation of the current flowing in the battery string 5 in the charge (discharge). Note that, in the example of FIG. 3, the internal state of the battery 6b is substantially estimated by estimating the second internal state parameter. In addition, in the example of FIG. 4A and FIG. 4B, an internal state of a virtual battery, the voltage of which varies like the minimum voltage Vmin in the charge, is estimated by estimating the second internal state parameter.

Besides, the internal state estimation unit 15 estimates a third internal state parameter, based on the third voltage data or the like. The third internal state parameter is a parameter indicative of an internal state of the battery string 5, i.e. a parameter indicative of an internal state in the entirety of the series-connected part of the batteries 6. Accordingly, by estimating the third internal state parameter, the internal state of the battery string 5 is estimated. In one example, the internal state estimation unit 15 estimates the third internal state parameter by performing charge curve analysis (discharge curve analysis), for example, by analyzing the third voltage data indicative of the variation of the voltage of the entirety of the battery string 5 (the voltage of the entirety of the series-connected part of the batteries 6) in the charge (discharge), and the data indicative of the variation of the current flowing in the battery string 5 in the charge (discharge).

Here, each of the above-described first to third internal state parameters includes, for example, any one of a positive electrode capacitance (or a positive electrode mass), a negative electrode capacitance (or a positive electrode mass), an initial charge amount of the positive electrode, an initial charge amount of the negative electrode, and an internal resistance. In addition, each of the first to third internal state parameters may include an SOW (Shift of Operation Window) which is a shift between the initial charge amount of the positive electrode and the initial charge amount of the negative electrode. It should be noted, however, that the first internal state parameter and the second internal state parameter are internal state parameters relating to the elemental battery 6, and the third internal state parameter is an internal state parameter relating to the entirety of the battery string 5 (the entirety of the series-connected part).

Figure 5:
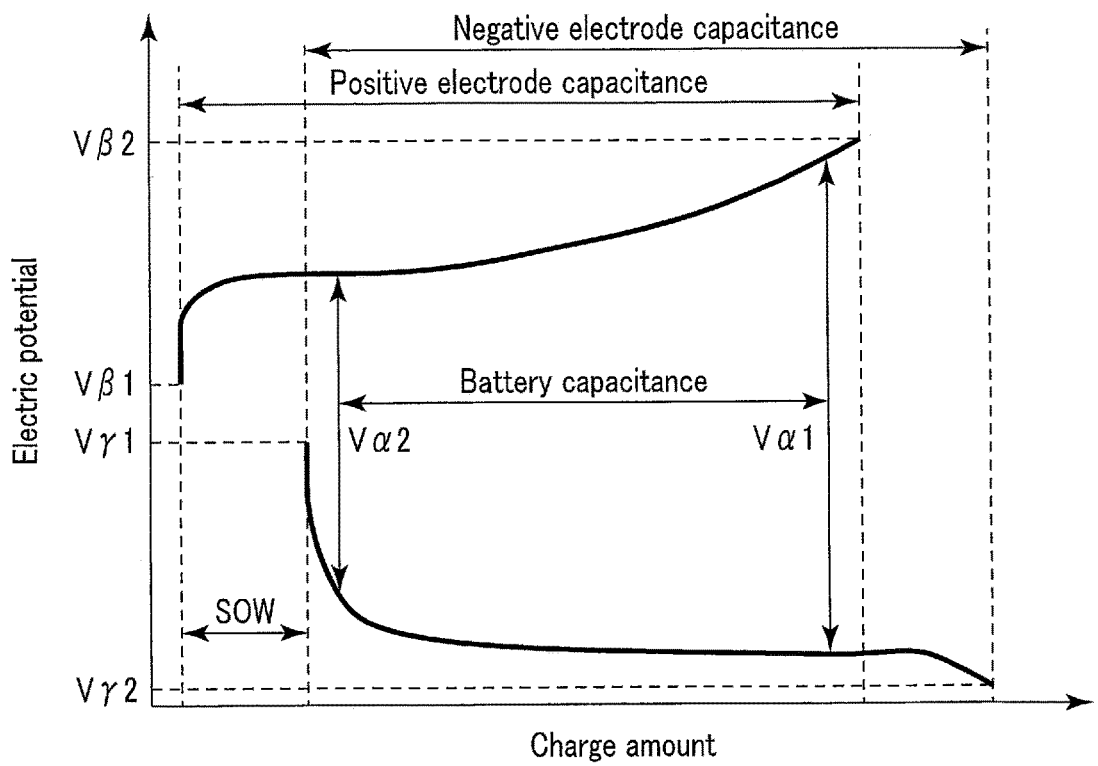
FIG. 5 is a schematic view for explaining internal state parameters indicative of the internal state of an elemental battery, such as a first internal state parameter and a second internal state parameter.

FIG. 5 is a schematic view for explaining the internal state parameters indicative of the internal state of the elemental battery, such as the first internal state parameter and the second internal state parameter. As shown in FIG. 5, in the battery 6 or the like, a charge amount until the charge amount of the positive electrode reaches an upper-limit charge amount from an initial charge amount is a positive electrode capacitance. In addition, a charge amount of the positive electrode in a state in which the positive electrode potential (the electric potential of the positive electrode terminal) becomes $V\beta 1$ is defined as the initial charge amount, and a charge amount of the positive electrode in a state in which the positive electrode potential becomes $V\beta 2$, which is higher than $V\beta 1$, is defined as the upper-limit charge amount. Besides, in the battery 6 or the like, a charge amount until the charge amount of the negative electrode reaches an upper-limit charge amount from an initial charge amount is a negative electrode capacitance. In addition, a charge amount of the negative electrode in a state in which the negative electrode potential (the electric potential of the negative electrode terminal) becomes $V\gamma1$ is defined as the initial charge amount, and a charge amount of the negative electrode in a state in which the negative electrode potential becomes $V\gamma2$, which is lower than $V\gamma1$, is defined as the upper-limit charge amount.

Besides, when the battery string 5 is regarded as one battery, also in the battery string 5, like the elemental battery 6, a charge amount until the charge amount of the positive electrode reaches an upper-limit charge amount from an initial charge amount is a positive electrode capacitance, and a charge amount until the charge amount of the negative electrode reaches an upper-limit charge amount from an initial charge amount is a negative electrode capacitance. It should be noted, however, that, in the battery string 5, if the number of series-connected batteries 6 in the battery string 5 is N, the charge amount of the positive electrode in a state in which the positive electrode potential (the electric potential of the positive electrode terminal) becomes $N \times V\beta1$ is defined as the initial charge amount, and the charge amount of the positive electrode in a state in which the positive electrode potential becomes $N \times V\beta2$ is defined as the upper-limit charge amount. In addition, in the battery string 5, the charge amount of the negative electrode in a state in which the negative electrode potential (the electric potential of the negative electrode terminal) becomes $N \times V\gamma1$ is defined as the initial charge amount, and the charge amount of the negative electrode in a state in which the negative electrode potential becomes $N \times V\gamma2$ is defined as the upper-limit charge amount. Further, the positive electrode mass can be estimated from the estimated positive electrode capacitance and the kind of material, of which the positive electrode is formed. Similarly, the negative electrode mass can be estimated from the estimated negative electrode capacitance and the kind of material, of which the negative electrode is formed.

In each of the battery string 5 and batteries 6, each of the above-described positive electrode capacitance and negative electrode capacitance decreases due to the deterioration by repetitive charge and discharge, compared to when the use thereof was started. In addition, in each of the battery string 5 (series-connected part) and batteries 6, the above-described SOW varies from the time of the start of use due to deterioration. Further, in the battery string 5, if a deterioration variance increases among the batteries 6, a variance increases among the batteries 6 in regard to the internal state parameters, such as the positive electrode capacitance, negative electrode capacitance and SOW.

Note that, in each of the battery string 5 and the elemental battery 6, a battery capacitance is defined as a battery characteristic parameter indicative of battery characteristics. The battery capacitance corresponds to a charge amount until the difference between the positive electrode potential and the negative electrode potential reaches Vat from Val (see FIG. 5). In each of the battery string 5 and the elemental battery 6, an open circuit voltage (OCV) and an OCV curve are battery characteristic parameters, in addition to the battery capacitance. The OCV curve is a function indicative of a relationship between a parameter other than the OCV, and the OCV. For example, the OCV curve is a function indicative of a relationship of the OCV to the SOC or the charge amount. In addition, in each of the battery string 5 and the elemental battery 6, the internal resistance, which is one of the internal state parameters, is also a battery characteristic parameter indicative of battery characteristics. In one example, the internal state estimation unit 15 may estimate the above-described battery characteristic parameter, based on the estimated internal state parameter.

The data storage unit 17 stores arithmetic data which is used in arithmetic operations in the above-described estimation of the internal state parameters. The internal state estimation unit 15 reads arithmetic data, which is necessary for the estimation of the internal state parameters or the like, from the data storage unit 17. The arithmetic data includes, for example, a function indicative of the OCP (Open Circuit Potential) of the positive electrode relative to the SOC of the positive electrode in each of the elemental battery 6 and the battery string 5, and a function indicative of the OCP of the negative electrode relative to the SOC of the negative electrode in each of the elemental battery 6 and the battery string 5. In addition, in the estimation of the above-described internal state parameters, interim estimation values or the like are calculated in a process of obtaining an ultimate estimation result. The above-described arithmetic data may include an interim estimation value of each of the internal state parameters. Besides, the internal state estimation unit 15 can store, in the data storage unit 17, those estimation values, among the interim and ultimate estimation values of the internal state parameters, which become necessary in the subsequent estimation process.

Note that the estimation of the internal state parameters of an elemental battery by charge curve analysis is disclosed in, for example, a reference literature 1 (Jpn. Pat. Appln. KOKAI Publication No. 2018-147827). In the present embodiment, for example, like the charge curve analysis of the reference literature 1, the above-described internal state parameters are estimated. In addition, the estimation of the battery characteristic parameter based on the internal state parameters may be performed in the same manner as described in the reference literature 1. For example, when the OCV curve is estimated as the battery characteristic parameter, an upper-limit voltage and a lower-limit voltage, which are imposed on the OCV in regard to each of the elemental battery 6 and the battery string 5, are stored in the data storage unit 17 as arithmetic data.

The determination unit 16 executes a process by using the first internal state parameter, second internal state parameter and third internal state parameter which are estimated by the internal state estimation unit 15. The determination unit 16 determines the deterioration variance among the batteries 6 of the battery string 5, based on at least the first internal state parameter and the second internal state parameter. The determination unit 16 compares the first internal state parameter and the second internal state parameter in the determination of the deterioration variance among the batteries 6. In one example, the determination unit 16 calculates a difference between the first internal state parameter and the second internal state parameter. In addition, the determination unit 16 determines that the deterioration variance among the batteries 6 is greater, as the difference between the first internal state parameter and the second internal state parameter becomes greater.

Here, the determination unit 16 determines the deterioration variance among the batteries 6, based on one or more determination items. The data storage unit 17 stores reference data which serves as a reference of a relationship of a deterioration variance to one or more determination items. The determination unit 16 reads the reference data from the data storage unit 17, and determines the deterioration variance, based on the above-described first internal state parameter, the second internal state parameter and the reference data. An example of the determination items in the determination of the deterioration variance is a difference between the first internal state parameter and the second internal state parameter. Specifically, a difference between the first internal state parameter and the second internal state parameter in regard to any one of the positive electrode capacitance, the negative electrode capacitance, the SOW and the internal resistance is used as a determination item.

In addition, by the first internal state parameter being estimated as described above, a first related parameter that is related to the first internal state parameter can be estimated. Examples of the first related parameter include a battery capacitance, a battery capacity retention ratio, a positive electrode capacity retention ratio and a negative electrode capacity retention ratio of the elemental battery 6 in a case where the voltage varies like the first voltage data in the charge or discharge. In addition, by the second internal state parameter being estimated as described above, a second related parameter that is related to the second internal state parameter can be estimated. Examples of the second related parameter include a battery capacitance, a battery capacity retention ratio, a positive electrode capacity retention ratio and a negative electrode capacity retention ratio of the elemental battery 6 in a case where the voltage varies like the second voltage data in the charge or discharge. Here, the positive electrode capacity retention ratio is the ratio of the estimated positive electrode capacitance to the positive electrode capacitance at the time of the start of use, and the negative electrode capacity retention ratio is the ratio of the estimated negative electrode capacitance to the negative electrode capacitance at the time of the start of use.

In the determination of the deterioration variance among the batteries 6, the determination unit 16 may compare the first related parameter and the second related parameter, instead of comparing the first internal state parameter and the second internal state parameter, or in addition to comparing the first internal state parameter and the second internal state parameter. In one example, the determination unit 16 determines that the deterioration variance among the batteries 6 is greater, as the difference between the first related parameter and the second related parameter becomes greater. In this case, the determination items in the determination of the deterioration variance include, for instance, a difference between the first related parameter and the second related parameter. Specifically, a difference between the first related parameter and the second related parameter in regard to any one of the battery capacitance, battery capacity retention ratio, positive electrode capacity retention ratio and negative electrode capacity retention ratio is used as a determination item.

Figure 6:
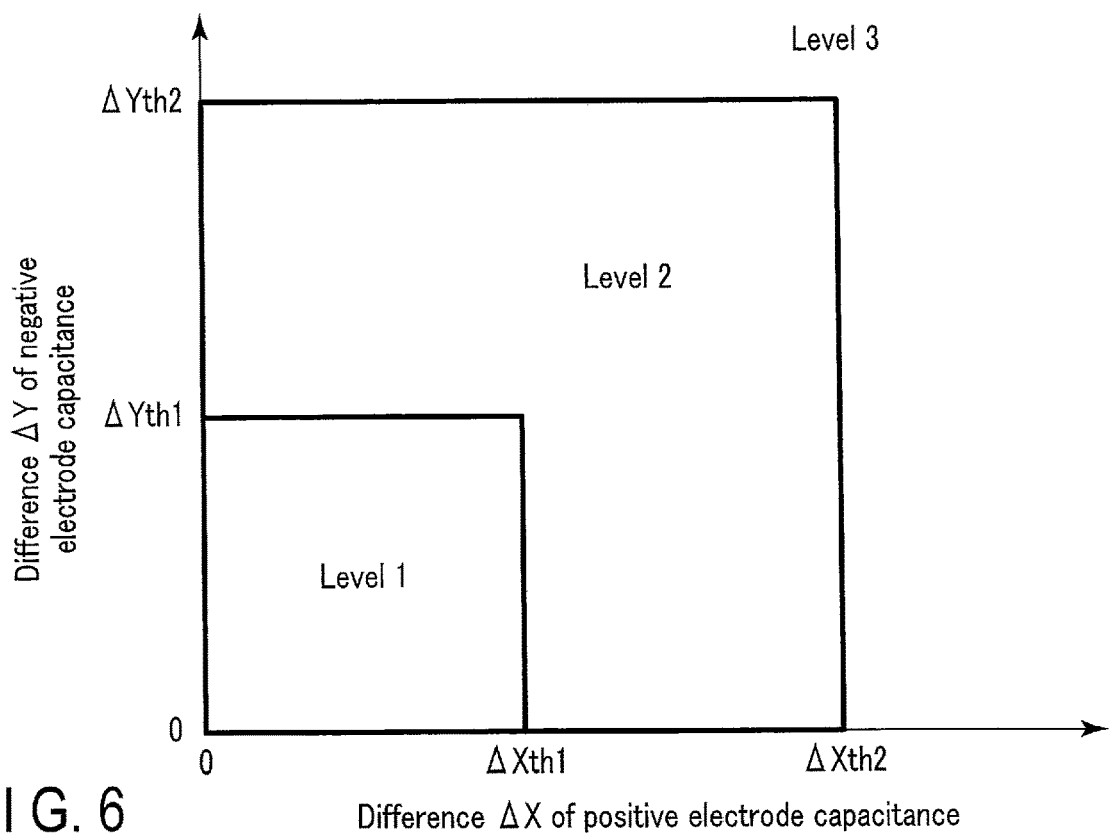
FIG. 6 is a schematic view illustrating an example of reference data, which serves as a reference of a relationship of a deterioration variance among a plurality of batteries with respect to one or more determination items.

FIG. 6 is a schematic view illustrating an example of reference data, which serves as a reference of a relationship of a deterioration variance among a plurality of batteries with respect to one or more determination items. In the example of FIG. 6, the determination is performed based on two determination items, namely a difference $\Delta X$ of the positive electrode capacitance between the first internal state parameter and the second internal state parameter, and a difference $\Delta Y$ of the negative electrode capacitance between the first internal state parameter and the second internal state parameter. In the reference data of FIG. 6, two thresholds $\Delta Xth1$ and $\Delta Xth2$ ($\Delta Xth1 < \Delta Xth2$) are set in regard to the difference $\Delta X$ of the positive electrode capacitance, and two thresholds $\Delta Yth1$ and $\Delta Yth2$ ($\Delta Yth1 < \Delta Yth2$) are set in regard to the difference $\Delta Y$ of the negative electrode capacitance.

In the determination based on the reference data of FIG. 6, when the difference $\Delta X$ of the positive electrode capacitance is less than the threshold $\Delta Xth1$ and the difference $\Delta Y$ of the negative electrode capacitance is less than the threshold $\Delta Yth1$, the determination unit 16 sets the deterioration variance among the batteries 6 at "Level 1", and determines that the deterioration variance is relatively small. In addition, in each of the case where the difference $\Delta X$ of the positive electrode capacitance is less than the threshold $\Delta Xth2$ and the difference $\Delta Y$ of the negative electrode capacitance is the threshold $\Delta Yth1$ or more and is less than $\Delta Yth2$, and the case where the difference $\Delta X$ of the positive electrode capacitance is the threshold $\Delta Xth1$ or more and is less than $\Delta Xth2$, and the difference $\Delta Y$ of the negative electrode capacitance is less than the threshold $\Delta Yth2$, the determination unit 16 sets the deterioration variance among the batteries 6 at "Level 2", and determines that the deterioration variance is in an intermediate level. Further, in each of the case where the difference $\Delta X$ of the positive electrode capacitance is the threshold $\Delta Xth2$ or more, and the case where the difference $\Delta Y$ of the negative electrode capacitance is the threshold $\Delta Yth2$ or more, the determination unit 16 sets the deterioration variance among the batteries 6 at "Level 3", and determines that the deterioration variance is relatively large.

Note that, in the example of FIG. 6, the deterioration variance among the batteries 6 is divided into the three levels, but the deterioration variance among the batteries 6 may be divided into, for example, five levels. Besides, the deterioration variance among the batteries 6 may be indicated by a variance index or the like. In this case, for example, as the variance index becomes greater, the deterioration variance among the batteries 6 is determined to be greater.

In addition, based on at least the third internal state parameter, the determination unit 16 determines a deterioration degree in the entirety of the battery string 5, i.e. a deterioration degree in the entirety of the series-connected part of the batteries 6. Here, based on one or more determination items, the determination unit 16 determines the degree of deterioration of the battery string 5. The data storage unit 17 stores reference data which serves as a reference of a relationship of a deterioration degree of the battery string 5 with respect to one or more determination items. The determination unit 16 reads the reference data from the data storage unit 17, and determines the deterioration degree, based on the above-described third internal state parameter and the reference data. The determination items in the determination of the deterioration degree of the battery string 5 include the positive electrode capacitance, negative electrode capacitance, SOW and internal resistance of the battery string 5, which are estimated as the third internal state parameters.

In addition, by the third internal state parameter being estimated as described above, a third related parameter which is related to the third internal state parameter can be estimated. Examples of the third related parameter include a battery capacitance, a battery capacity retention ratio, a positive electrode capacity retention ratio and a negative electrode capacity retention ratio of the battery string 5. In the determination of the deterioration degree of the battery string 5, the determination unit 16 may use, as a determination item, any one of the third related parameters, instead of the third internal state parameter, or in addition to the third internal state parameter.

In one example, the deterioration degree of the battery string 5 is determined based on two determination items, namely the positive electrode capacity retention ratio and the negative electrode capacity retention ratio of the battery string 5, which are third related parameters. In this case, the determination unit 16 determines that the deterioration degree of the battery string 5 is smaller, as the positive electrode capacity retention ratio is greater, i.e. as the positive electrode capacity retention ratio is closer to 100%. In addition, the determination unit 16 determines that the deterioration degree of the battery string 5 is smaller, as the negative electrode capacity retention ratio is greater, i.e. as the negative electrode capacity retention ratio is closer to 100%.

Besides, the determination unit 16 may determine the deterioration variance among the batteries 6 of the battery string 5, based on the third internal state parameter in addition to the first internal state parameter and the second internal state parameter. In this case, the determination unit 16 determines the deterioration variance among the batteries 6 by comparing the third internal state parameter with the first internal state parameter and the second internal state parameter. In one example, the determination unit 16 calculates a difference between the first internal state parameter and the third internal state parameter, and a difference between the second internal state parameter and the third internal state parameter. Then, the determination unit 16 determines the deterioration variance among the batteries 6, based on the difference between the first internal state parameter and the third internal state parameter, and the difference between the second internal state parameter and the third internal state parameter.

In one example, an absolute value $\varepsilon 1$ of a difference of the negative electrode capacitance between the first internal state parameter and the third internal state parameter, and an absolute value $\varepsilon 2$ of a difference of the negative electrode capacitance between the second internal state parameter and the third internal state parameter, are calculated. Then, based on the absolute values $\varepsilon 1$ and $\varepsilon 2$ of the differences, the determination unit 16 determines the deterioration variance among the batteries 6. In this case, the determination unit 16 determines, for example, whether or not either the absolute value $\varepsilon 1$ of the difference or the absolute value $\varepsilon 2$ of the difference is a threshold Eth or more. If each of the absolute value $\varepsilon 1$ of the difference and the absolute value $\varepsilon 2$ of the difference is less than the threshold Eth, the determination unit 16 determines that the deterioration variance among the batteries 6 is small. On the other hand, if either the absolute value $\varepsilon 1$ of the difference or the absolute value $\varepsilon 2$ of the difference is the threshold Eth or more, the determination unit 16 determines that the deterioration variance among the batteries 6 is large.

In addition, when either the absolute value $\varepsilon 1$ of the difference or the absolute value $\varepsilon 2$ of the difference is the threshold Eth or more, i.e. when the deterioration variance among the batteries 6 is determined to be large, the determination unit 16 determines whether the absolute values $\varepsilon 1$ and $\varepsilon 2$ are greatly different from each other. Then, if the absolute values $\varepsilon 1$ and $\varepsilon 2$ are greatly different from each other, the determination unit 16 determines which of the absolute values $\varepsilon 1$ and $\varepsilon 2$ is greater. Then, if the absolute values $\varepsilon 1$ and $\varepsilon 2$ are greatly different from each other, and the absolute value $\varepsilon 2$ is greater than the absolute value $\varepsilon 1$, the determination unit determines that the deterioration variance among the batteries 6 is large, and determines that the safety and performance of the battery string 5 greatly deteriorate. Thus, in the determination using the absolute values $\varepsilon 1$ and $\varepsilon 2$, the safety or the like of the battery string 5, in addition to the deterioration variance among the batteries 6, is determined.

As described above, in the present embodiment, the determination device 3 determines the deterioration variance among the batteries 6 in the battery string 5, based on at least the first voltage data and the second voltage data. In addition, the determination device 3 determines the deterioration degree of the entirety of the battery string 5 (the entirety of the series-connected part), based on the third voltage data. Besides, the determination device 3 may be capable of notifying a user or the like of the battery-mounted device, in which the storage battery 2 is mounted, of the determination result by the above-described determination via a user interface or the like. In this case, the determination result may be notified by voice, or may be notified by screen display or the like.

Figure 7:
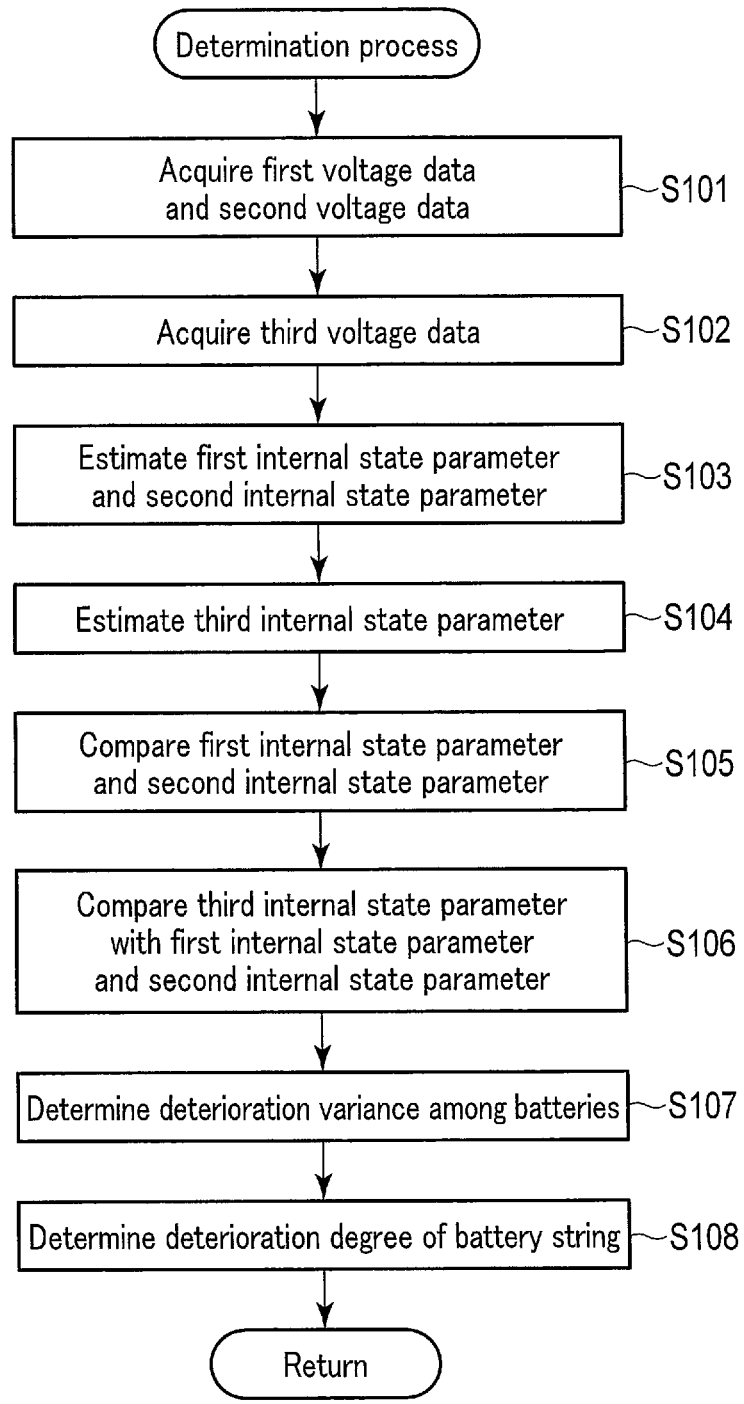
FIG. 7 is a flowchart illustrating a determination process in regard to a certain battery string, which is executed by a determination device according to the embodiment.

FIG. 7 is a flowchart illustrating a determination process in regard to a certain battery string, which is executed by the determination device according to the embodiment. The determination process of FIG. 7 is periodically executed at a predetermined timing based on any one of an operation time of the battery, an operation power amount, other indices, a specific event, and the like. In one example, the process of FIG. 7 is repetitively executed at predetermined intervals. In another example, the process of FIG. 7 is executed based on the input of an operation instruction through a user interface by a user or the like of the battery-mounted device in which the storage battery 2 is mounted.

If the process of FIG. 7 is started, the data acquisition unit 13 of the determination device 3 acquires the above-described first voltage data and second voltage data (S101). At this time, the data acquisition unit 13 may receive the first voltage data and second voltage data generated by the battery management unit 12 or the like, or the data acquisition unit 13 may generate the first voltage data and second voltage data. Then, the data acquisition unit 13 acquires the above-described third voltage data (S102). Subsequently, the internal state estimation unit 15 estimates the first internal state parameter, based on the first voltage data, as described above, and estimates the second internal state parameter, based on the second voltage data, as described above (S103). Further, the internal state estimation unit 15 estimates the third internal state parameter, based on the third voltage data, as described above (S104).

In addition, the determination unit 16 compares the first internal state parameter and the second internal state parameter (S105). At this time, the determination unit 16 may compare the above-described first related parameter and second related parameter, instead of comparing the first internal state parameter and the second internal state parameter, or in addition to comparing the first internal state parameter and the second internal state parameter. Further, the determination unit 16 may compare the third internal state parameter with the first internal state parameter and the second internal state parameter, as described above (S106). Then, based on the comparison result or the like between the first internal state parameter and the second internal state parameter, the determination unit 16 determines the deterioration variance among the batteries 6 in the battery string 5 (S107). At this time, the deterioration variance among the batteries 6 in the battery string 5 may be determined based on the comparison result of the third internal state parameter with the first internal state parameter and the second internal state parameter, in addition to the comparison result between the first internal state parameter and the second internal state parameter. Further, the determination unit 16 determines the deterioration degree of the battery string 5 (the deterioration degree in the entirety of the series-connected part of the batteries 6), based on at least the third internal state parameter (S108).

In the present embodiment, the deterioration variance among the batteries 6 of the battery string 5 is determined based on the first voltage data indicative of the maximum voltage Vmax, which is greatest among the voltages of the batteries 6, in each measurement in a plurality of measuring periods in the charge or discharge of the battery string 5, and the second voltage data indicative of the minimum voltage Vmin, which is least among the voltages of the batteries 6, in each measurement in the measuring periods in the charge or discharge of the battery string 5. Thus, in the determination process of the deterioration variance, there is no need to execute the process or the like of estimating the internal state in regard to all of the batteries 6. Accordingly, the deterioration variance among the batteries 6 is determined without complicating the structure and process for acquiring data. In addition, in the present embodiment, since the determination is executed based on the first voltage data indicative of the variation of the maximum voltage Vmax in the charge or discharge of the battery string 5, and the second voltage data indicative of the variation of the minimum voltage Vmin in the charge or discharge of the battery string 5, the deterioration variation among the batteries 6 is appropriately determined.

In addition, in the present embodiment, the first internal state parameter is estimated as the internal state of the elemental battery 6 in the case where the voltage in each measurement in the plural periods becomes identical to the maximum voltage Vmax of the first voltage data, and the second internal state parameter is estimated as the internal state of the elemental battery 6 in the case where the voltage in each measurement in the plural periods becomes identical to the minimum voltage Vmin of the second voltage data. In addition, for example, by comparing the first internal state parameter and the second internal state parameter, the deterioration variance among the batteries 6 is determined. By performing the determination based on the first internal state parameter and the second internal state parameter, the deterioration variance among the batteries 6 is more appropriately determined.

Note that, in each of the battery string 5 and the batteries 6, such elements as temperatures and an arrangement in the battery string 5, in addition to the deterioration degree, affect the voltage. Accordingly, by performing the determination based on the comparison or the like between the first internal state parameter and the second internal state parameter, the precision of the determination in regard to the deterioration variance among the batteries 6 is improved, compared to, for example, the case where the determination is performed based on only the comparison between the first voltage data and the second voltage data.

Furthermore, in the present embodiment, the deterioration degree of the battery string 5 is determined based on the third voltage data indicative of the voltage of the battery string 5 (the voltage of the entirety of the series-connected part of the batteries 6) in each measurement in the plural periods in the charge or discharge of the battery string 5. Thus, in the present embodiment, while keeping small the amount of data necessary for the process, i.e. without complicating the structure and process for acquiring the data, the deterioration degree of the battery string 5, in addition to the deterioration variance among the batteries 6, is determined. In addition, in the present embodiment, the third internal state parameter indicative of the internal state of the battery string 5 is estimated based on the third voltage data, and the deterioration degree of the battery string 5 is estimated based on the third internal state parameter. Therefore, the deterioration degree of the battery string 5 is also appropriately determined.

Note that, in the above-described embodiment and the like, the determination device 3 is a computer (server) other than the battery management unit 12, or a server in a cloud environment, but the determination device 3 is not limited to this. In one embodiment, each of the battery management units 12 may perform the determination in regard to the corresponding battery string 5. In this case, each of the battery management units 12 executes the same process as the determination device 3 of the above-described embodiment, thereby determining the deterioration variance among the batteries 6 in the corresponding battery string 5, and the deterioration degree of the corresponding battery string 5.

In at least one of the above-described embodiments or examples, a deterioration variance among a plurality of batteries, which are connected in series, is determined based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods. Thereby, there can be provided a determination device, an electricity storage system, a determination method and a determination program which can properly determine the deterioration variance among the series-connected batteries without complicating the structure and process for acquiring data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A determination device relating to a plurality of batteries which are connected in series, comprising:
   a processor configured to determine a deterioration variance among the batteries, based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods,
   wherein the processor is configured to:
   estimate a first internal state parameter as an internal state of the battery as an elemental battery, the first internal state parameter being based on a variation of the maximum voltage in the first voltage data;
   estimate a second internal state parameter as an internal state of the battery as the elemental battery, the second internal state parameter being based on a variation of the minimum voltage in the second voltage data;
   determine the deterioration variance among the batteries, based on at least the first internal state parameter and the second internal state parameter;
   estimate a third internal state parameter indicative of an internal state in an entirety of a series-connected part of the batteries, based on at least third voltage data indicative of a voltage of the series-connected part of the batteries in each of the measurements in the periods in the charge or the discharge of the batteries; and determine the deterioration variance among the batteries by comparing the third internal state parameter with the first internal state parameter and the second internal state parameter.

2. The determination device of claim 1, wherein the processor is configured to determine the deterioration variance among the batteries by comparing the first internal state parameter and the second internal state parameter.

3. The determination device of claim 2, wherein the processor is configured to determine that the deterioration variance among the batteries is greater as a difference between the first internal state parameter and the second internal state parameter becomes greater.

4. The determination device of claim 1, wherein the processor is configured to determine a deterioration degree in an entirety of a series-connected part of the batteries, based on third voltage data indicative of a voltage of the series-connected part of the batteries in each of the measurements in the periods in the charge or the discharge of the batteries.

5. The determination device of claim 4, wherein the processor is configured to: determine the deterioration degree in the entirety of the series-connected part of the batteries, based on at least the third internal state parameter.

6. An electricity storage system comprising:
the determination device of claim 1; and
the plurality of batteries connected in series,
wherein the processor of the determination device being configured to determine the deterioration variance among the batteries.

7. The electricity storage system of claim 6, further comprising a measuring circuit configured to periodically measure the voltage of each of the batteries in each of the measurements in the periods in the charge or the discharge of the batteries,
wherein the first voltage data and the second voltage data are generated based on at least a measurement result of the voltage of each of the batteries in the measuring circuit.

8. The electricity storage system of claim 6, wherein each of the batteries includes a plurality of unit cells, and the unit cells are connected in parallel in each of the batteries.

9. A determination method relating to a plurality of batteries which are connected in series, comprising:
determining a deterioration variance among the batteries, based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods,
wherein the determining the deterioration variance comprising:
estimating a first internal state parameter as an internal state of the battery as an elemental battery, the first internal state parameter being based on a variation of the maximum voltage in the first voltage data;
estimating a second internal state parameter as an internal state of the battery as the elemental battery, the second internal state parameter being based on a variation of the minimum voltage in the second voltage data;
determining the deterioration variance among the batteries, based on at least the first internal state parameter and the second internal state parameter;
estimating a third internal state parameter indicative of an internal state in an entirety of a series-connected part of the batteries, based on at least third voltage data indicative of a voltage of the series-connected part of the batteries in each of the measurements in the periods in the charge or the discharge of the batteries; and
determining the deterioration variance among the batteries by comparing the third internal state parameter with the first internal state parameter and the second internal state parameter.

10. A non-transitory storage medium storing a determination program relating to a plurality of batteries which are connected in series, the determination program causing a computer to implement:
determining a deterioration variance among the batteries, based on first voltage data indicative of a maximum voltage which is greatest among voltages of the batteries in each of measurements in a plurality of periods in charge or discharge of the batteries, and second voltage data indicative of a minimum voltage which is least among the voltages of the batteries in each of the measurements in the periods,
wherein the determining the deterioration variance comprising:
estimating a first internal state parameter as an internal state of the battery as an elemental battery, the first internal state parameter being based on a variation of the maximum voltage in the first voltage data;
estimating a second internal state parameter as an internal state of the battery as the elemental battery, the second internal state parameter being based on a variation of the minimum voltage in the second voltage data;
determining the deterioration variance among the batteries, based on at least the first internal state parameter and the second internal state parameter;
estimating a third internal state parameter indicative of an internal state in an entirety of a series-connected part of the batteries, based on at least third voltage data indicative of a voltage of the series-connected part of the batteries in each of the measurements in the periods in the charge or the discharge of the batteries; and
determining the deterioration variance among the batteries by comparing the third internal state parameter with the first internal state parameter and the second internal state parameter.

* * * * *